(12) United States Patent
Roy et al.

(10) Patent No.: US 8,559,159 B2
(45) Date of Patent: Oct. 15, 2013

(54) ELECTROSTATIC CHUCK AND METHODS OF USE THEREOF

(75) Inventors: Shambhu N. Roy, Sunnyvale, CA (US); Martin Lee Riker, Milpitas, CA (US); Keith A. Miller, Mountain View, CA (US); Vijay D. Parkhe, San Jose, CA (US); Steven V. Sansoni, Livermore, CA (US)

(73) Assignee: Applied Materials, Inc., Santa Clara, CA (US)

( * ) Notice: Subject to any disclaimer, the term of this patent is extended or adjusted under 35 U.S.C. 154(b) by 78 days.

(21) Appl. No.: 13/198,204

(22) Filed: Aug. 4, 2011
(Under 37 CFR 1.47)

(65) Prior Publication Data

US 2012/0033340 A1 Feb. 9, 2012

Related U.S. Application Data

(60) Provisional application No. 61/371,455, filed on Aug. 6, 2010.

(51) Int. Cl.
*H01T 23/00* (2006.01)
(52) U.S. Cl.
USPC ........................................................ 361/234
(58) Field of Classification Search
USPC ........................................................ 361/234
See application file for complete search history.

(56) References Cited

U.S. PATENT DOCUMENTS

| 7,457,098 | B2 | 11/2008 | Nakamura |
| 7,952,049 | B2* | 5/2011 | Tsukamoto ............. 219/121.58 |
| 8,194,384 | B2* | 6/2012 | Nasman et al. ............... 361/234 |
| 2003/0169553 | A1* | 9/2003 | Brown et al. ................. 361/234 |
| 2008/0236493 | A1 | 10/2008 | Sakao |
| 2009/0059461 | A1* | 3/2009 | Yonekura et al. ............. 361/234 |
| 2010/0039747 | A1* | 2/2010 | Sansoni et al. ................ 361/234 |
| 2010/0053841 | A1 | 3/2010 | Rusinko, Jr. et al. |
| 2010/0247804 | A1 | 9/2010 | Roy |

OTHER PUBLICATIONS

International Search Report and Written Opinion mailed Apr. 9, 2012 for PCT Application No. PCT/US2011/046611.

* cited by examiner

*Primary Examiner* — Dharti Patel
(74) *Attorney, Agent, or Firm* — Moser Taboada; Alan Taboada

(57) ABSTRACT

An electrostatic chuck and method of use thereof is provided herein. In some embodiments, an electrostatic chuck may include a disk having a first side to support a substrate thereon and a second side, opposing the first side, to provide an interface to selectively couple the disk to a thermal control plate, a first electrode disposed within the disk proximate the first side to electrostatically couple the substrate to the disk and a second electrode disposed within the disk proximate the opposing side of the disk to electrostatically couple the disk to the thermal control plate. In some embodiments, the second electrode may also be configured to heat the disk.

20 Claims, 8 Drawing Sheets

ELECTROSTATIC CHUCK AND METHODS OF USE THEREOF

CROSS-REFERENCE TO RELATED APPLICATIONS

This application claims benefit of U.S. provisional patent application Ser. No. 61/371,455, filed Aug. 6, 2010, which is herein incorporated by reference.

FIELD

Embodiments of the present invention generally relate to electrostatic chucks and methods of use thereof.

BACKGROUND

An electrostatic chuck (ESC) is often used to electrostatically retain a substrate on a substrate support. Conventionally, an ESC comprises a ceramic body having one or more electrodes disposed therein. The inventors have discovered that due to the high thermal inertia (e.g., low heat transfer rate) of the conventional ESC, the heating and cooling rates of the ESC is substantially limited, thereby limiting the efficiency of processes utilizing the ESC.

Accordingly, the inventors have provided an improved electrostatic chuck that can be rapidly heated and cooled.

SUMMARY

Embodiments of electrostatic chucks and methods of use thereof are provided herein. An electrostatic chuck and method of use thereof is provided herein. In some embodiments, an electrostatic chuck may include a disk having a first side to support a substrate thereon and a second side, opposing the first side, to provide an interface to selectively couple the disk to a thermal control plate, a first electrode disposed within the disk proximate the first side to electrostatically couple the substrate to the disk and a second electrode disposed within the disk proximate the opposing side of the disk to electrostatically couple the disk to the thermal control plate. In some embodiments, the second electrode may also be configured to heat the disk.

In some embodiments, a method of processing a substrate may include clamping a substrate on a first surface of a disk of an electrostatic chuck disposed within a process chamber by providing power to a first electrode disposed within the electrostatic chuck proximate to the first side; and selectively increasing or decreasing a rate of thermal conductivity through an interface disposed between a second side of the disk, opposite the first side, and a thermal control plate coupled to the disk to control the rate of heat transfer between the disk and the thermal control plate.

Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

Figure 1:
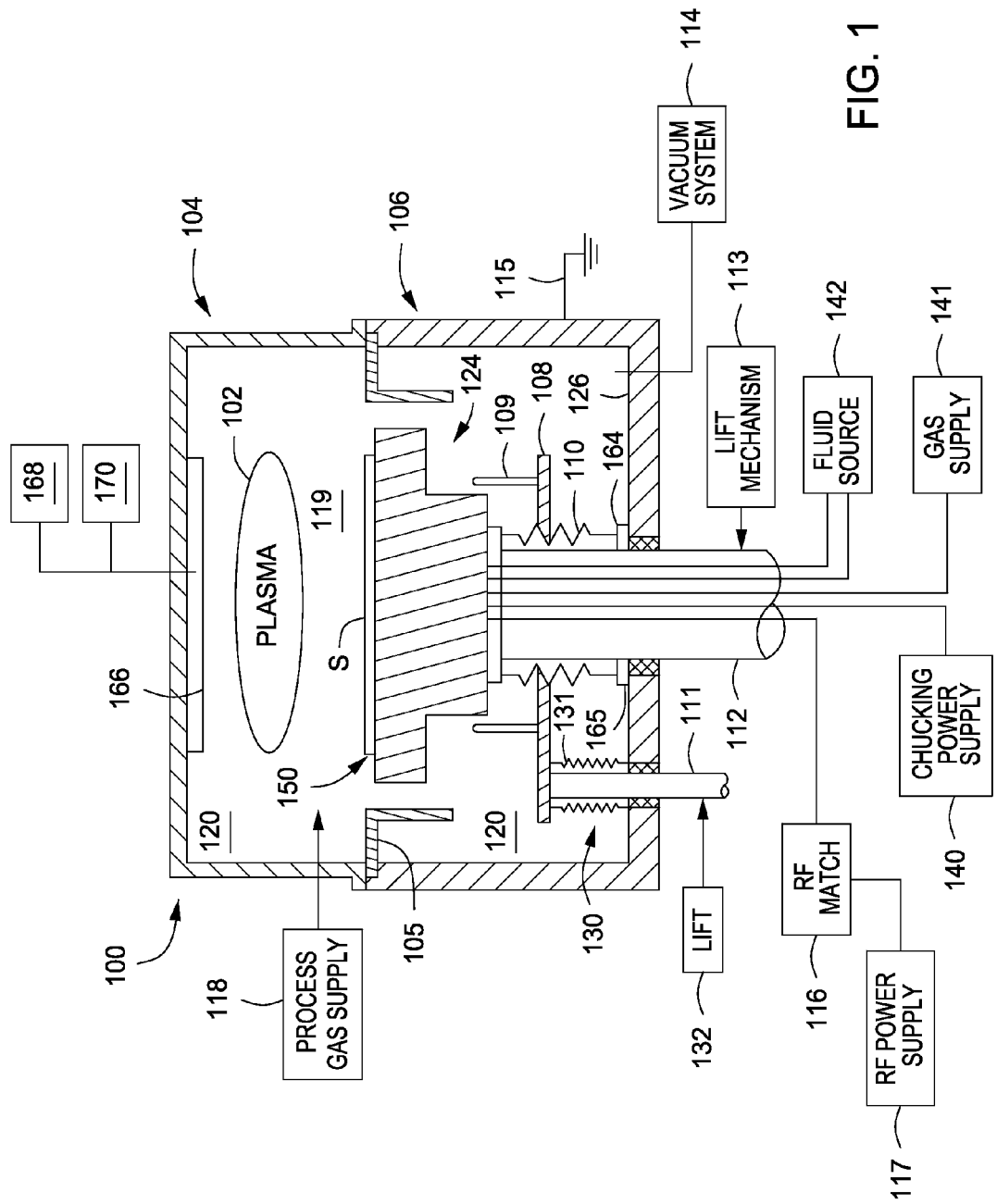
FIG. 1 depicts a process chamber suitable for use with an electrostatic chuck in accordance with some embodiments of the present invention

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of electrostatic chucks and method of use thereof are provided herein. The inventive apparatus may advantageously provide an electrostatic chuck that may be rapidly heated and cooled simultaneously with the rapid heating and cooling of a substrate disposed thereon, thereby providing process flexibility and increased throughput in substrate processing. The inventive electrostatic chuck may further advantageously reduce or eliminate damages to the substrate resulting from friction due to differences in thermal expansion of a substrate and electrostatic chuck during processing.

FIG. 1 is a schematic cross-sectional view of plasma processing chamber in accordance with some embodiments of the present invention. In some embodiments, the plasma processing chamber is a physical vapor deposition (PVD) processing chamber. However, other types of processing chambers that utilize electrostatic chucks may also be used with the inventive apparatus.

The chamber 100 is a vacuum chamber which is suitably adapted to maintain sub-atmospheric pressures within a chamber interior volume 120 during substrate processing. The chamber 100 includes a chamber body 106 covered by a dome 104 which encloses a processing volume 119 located in the upper half of chamber interior volume 120. The chamber 100 may also include one or more shields 105 circumscribing various chamber components to prevent unwanted reaction between such components and ionized process material. The chamber body 106 and dome 104 may be made of metal, such as aluminum. The chamber body 106 may be grounded via a coupling to ground 115.

A substrate support 124 may be disposed within the chamber interior volume 120 for supporting and chucking a substrate S, such as a semiconductor wafer or other such substrate as may be electrostatically retained. The substrate support 124 may generally include an electrostatic chuck 150 (described in more detail below) and a hollow support shaft 112 for supporting the electrostatic chuck 150. The hollow support shaft 112 provides a conduit to provide process gases, fluids, heat transfer fluids, power, or the like, to the electrostatic chuck 150.

In some embodiments, the hollow support shaft 112 is coupled to a lift mechanism 113 which provides vertical movement of the electrostatic chuck 150 between an upper, processing position (as shown in FIG. 1) and a lower, transfer position (not shown). A bellows assembly 110 is disposed about the hollow support shaft 112 and is coupled between the electrostatic chuck 150 and a bottom surface 126 of chamber 100 to provide a flexible seal that allows vertical motion of the electrostatic chuck 150 while preventing loss of vacuum from within the chamber 100. The bellows assembly 110 also includes a lower bellows flange 164 in contact with an o-ring 165 which contacts bottom surface 126 to help prevent loss of chamber vacuum.

The hollow support shaft 112 provides a conduit for coupling a fluid source 142, a gas supply 141, a chucking power supply 140, and one or more RF sources 117 (e.g., an RF plasma power supply and/or an RF bias power supply) to the electrostatic chuck 150. In some embodiments, the RF power supply 117 may be coupled to the electrostatic chuck via an RF matching network 116.

A substrate lift 130 may include lift pins 109 mounted on a platform 108 connected to a shaft 111 which is coupled to a second lift mechanism 132 for raising and lowering the substrate lift 130 so that the substrate "S" may be placed on or removed from the electrostatic chuck 150. The electrostatic chuck 150 includes thru-holes (described below) to receive the lift pins 109. A bellows assembly 131 is coupled between the substrate lift 130 and bottom surface 126 to provide a flexible seal which maintains the chamber vacuum during vertical motion of the substrate lift 130.

The chamber 100 is coupled to and in fluid communication with a vacuum system 114, which may include a throttle valve (not shown) and vacuum pump (not shown) which are used to exhaust the chamber 100. The pressure inside the chamber 100 may be regulated by adjusting the throttle valve and/or vacuum pump. The chamber 100 is also coupled to and in fluid communication with a process gas supply 118 which may supply one or more process gases to the chamber 100 for processing a substrate disposed therein.

In operation, for example, a plasma 102 may be created in the chamber interior volume 120 to perform one or more processes. The plasma 102 may be created by coupling power from a plasma power source (e.g., RF power supply 117) to a process gas via one or more electrodes (described below) within the chamber interior volume 120 to ignite the process gas and create the plasma 102. Alternatively or in combination, a plasma may be formed in the chamber interior volume 120 by other methods. In some embodiments, a bias power may be provided from a bias power supply (e.g., RF power supply 117) to one or more electrodes (described below) disposed within the substrate support or the electrostatic chuck 150 to attract ions from the plasma towards the substrate S.

In some embodiments, for example where the chamber 100 is a PVD chamber, a target 166 comprising a source material to be deposited on a substrate S may be disposed above the substrate and within the chamber interior volume 120. The target 166 may be supported by a grounded conductive portion of the chamber 100, for example an aluminum adapter through a dielectric isolator.

A controllable DC power source 168 may be coupled to the chamber 100 to apply a negative voltage, or bias, to the target 166. An RF power supply 117A-B may be coupled to the substrate support 124 in order to induce a negative DC bias on the substrate 100. In addition, in some embodiments, a negative DC self-bias may form on the substrate S during processing. In other applications, the substrate support 124 may be grounded or left electrically floating. In some embodiments, an RF power supply 170 may also be coupled to the chamber 100 to apply RF power to the target 166 to facilitate control of the radial distribution of a deposition rate on substrate S. In operation, ions in the plasma 102 created in the chamber 100 react with the source material from the target 166. The reaction causes the target 166 to eject atoms of the source material, which are then directed towards the substrate 100, thus depositing material.

In some embodiments, a rotatable magnetron (not shown) may be positioned proximate a back surface of the target 166. The magnetron may include a plurality of magnets configured to produce a magnetic field within the chamber 100, generally parallel and close to the surface of the target 166 to trap electrons and increase the local plasma density, which in turn increases the sputtering rate. The magnets produce an electromagnetic field around the top of the chamber 100, and are rotated to rotate the electromagnetic field which influences the plasma density of the process to more uniformly sputter the target 166.

Figure 1A:
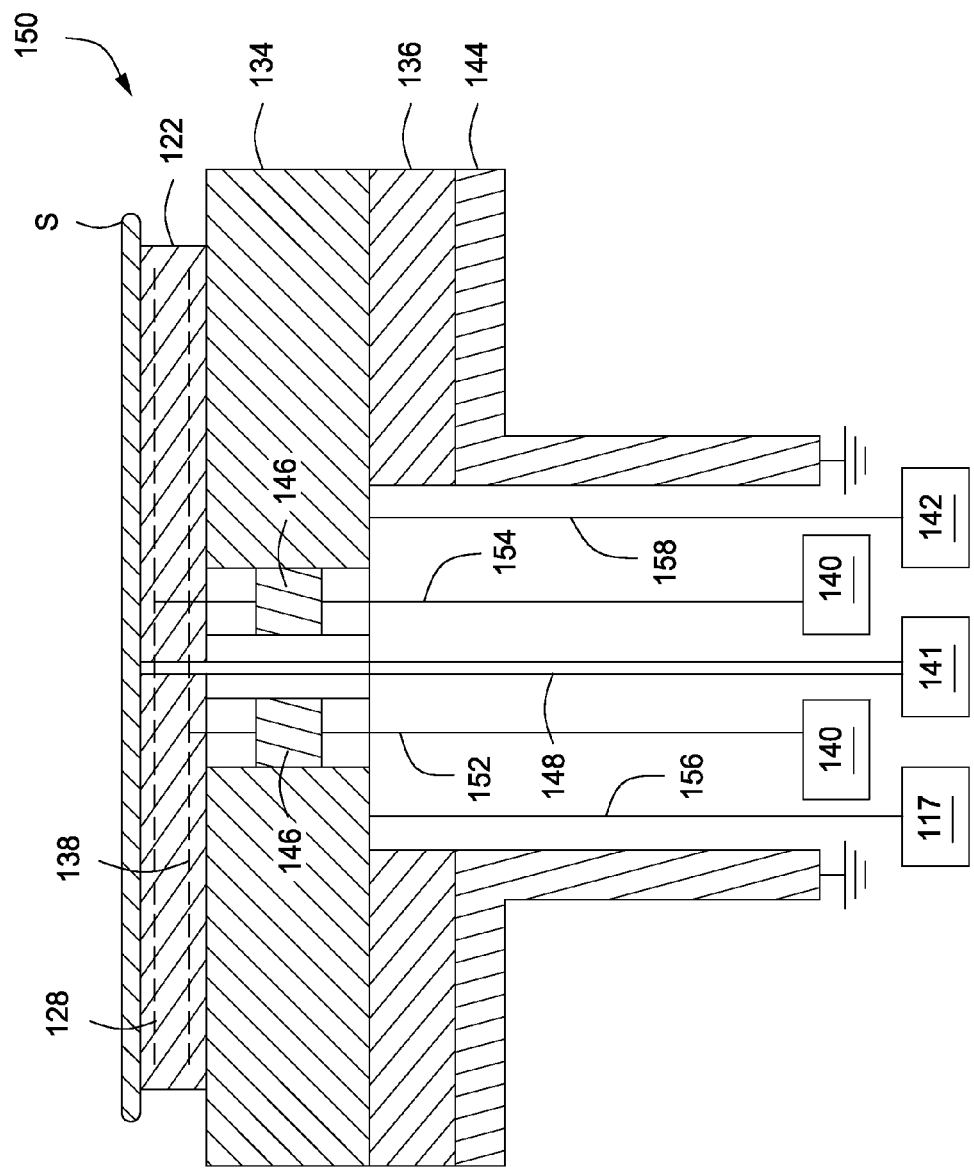
FIG. 1A depicts a schematic side view of an electrostatic chuck in accordance with some embodiments of the present invention.

FIG. 1A depicts a schematic side view of the electrostatic chuck 150 in accordance with some embodiments of the present invention. The electrostatic chuck 150 generally includes a disk 122 having a first surface for supporting the substrate S thereupon and an opposing second surface. A first electrode 128 is disposed proximate the first surface and may be coupled to the chucking power source 140, for example, via a conductor 154, to selectively electrostatically retain the substrate S on the first surface. A second electrode 138 is disposed proximate the second surface and may be coupled to the chucking power source 140, for example, via a conductor 152, to selectively electrostatically retain the disk 122 to a thermal control plate 134 disposed adjacent the disk 122. The chucking power source 140 may be one or more DC power sources that can provide up to about 4000 volts at a suitable power, for example from about 500 to about 4000 volts. Other magnitudes of DC power may also be used in electrostatic chucks having other configurations, for example, to retain smaller or larger substrates. A conduit 148 may be provided to couple the gas supply 141 to the electrostatic chuck, as discussed in more detail below.

A vacuum feedthrough 146 may be provided within the thermal control plate 134 (or in another suitable location) to facilitate passing the conductors 154, 154 and the conduit 148 through the thermal control plate 134 while maintaining isolation between the atmosphere within the processing volume 119 and the atmosphere outside the processing volume (for example, within the hollow shaft 112 and outside of the chamber 100.

The thermal control plate 134 may be fabricated, at least in part, from a thermally conductive material and may have one or more channels disposed therein for flowing a heat transfer fluid therethrough, for example via conduit 158 coupled to the fluid source 142, to facilitate controlling the rate of heat transfer to and/or from the disk 122 during use. The thermal control plate 134 may also be fabricated, at least in part, from an electrically conductive material and may be coupled to the RF power supply 117, for example via conductor 156, to act as an electrode to couple RF power to the plasma within the processing volume 119 during use. The RF power supply 117 may provide power, for example up to about 2000 watts at a suitable frequency, for example between about 2 MHz to about 60 MHz.

The thermal control plate 134 may be disposed atop an isolator 136 to electrically isolate the thermal control plate 134 from other electrically conductive components in the substrate support 124. A grounding shell 144 may be provided about the electrostatic chuck 150 (or substrate support 124) and may be coupled to ground to provide an RF return path to ground from the processing volume 119.

Figure 2:
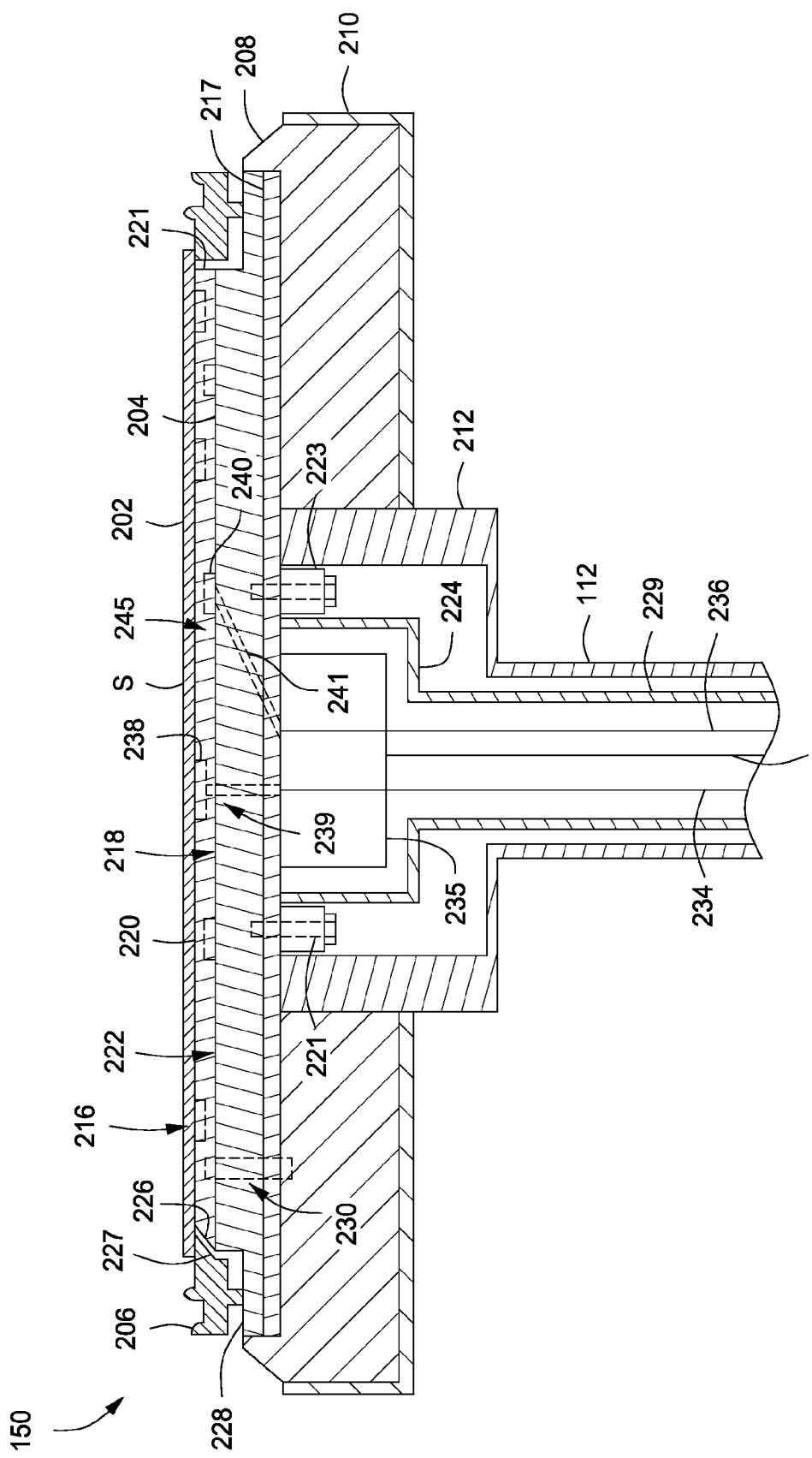
FIG. 2 depicts a cross-sectional side view of an electrostatic chuck in accordance with some embodiments of the present invention.

The electrostatic chuck may have a variety of configurations in accordance with the teachings provided herein. For example, FIG. 2 depicts a cross-sectional side view of an electrostatic chuck in accordance with some embodiments of the present invention. Referring to FIG. 2, the electrostatic chuck 150 generally comprises a disk 202 disposed atop a thermal control plate 204. The disk 202 has a substrate support surface opposite the thermal control plate 204 for supporting the substrate S. In some embodiments, the thermal control plate 204 may be disposed atop a hollow base 212, which is coupled to, and supported by, the hollow support shaft 112. In some embodiments, the thermal control plate 204 may additionally rest atop an insulating layer 208 disposed within a support housing 210. In such embodiments, the support housing 210 may provide mechanical support to the insulating layer 208 and thermal control plate 204. The insulating layer 208 may provide a electrical or radio frequency (RF) insulation between the thermal control plate 204 and the support housing 210. In some embodiments, the thermal control plate 204 is comprised of two or more plates, joined together during manufacturing. Plate 217 is shown as a possible second, connected part. When present, the plate 217 provides an interface for coupling the hollow support shaft 112 to the electrostatic chuck 150.

In some embodiments, a conduit 229, coupled to a housing 224 is disposed within the hollow support shaft 112. The housing 224 may be coupled to the thermal control plate 204 via any means suitable to provide adequate coupling. For example, in some embodiments, the housing 224 comprises a flange 223 having a through hole 221 configured to accept a fastener (e.g., a screw, bolt, pin or the like) to couple the housing 224 to the thermal control plate 204. In some embodiments, conduit 229, with housing 224 may be utilized as the conductor 156, transmitting appropriate RF power to the thermal control plate 204. Housing 224, along with the conduit 229, may also provide space to route RF bias power or other utilities to the thermal control plate 204. When provided, the housing 224 may house a manifold 235 (described below) comprising a plurality of through holes (described below) or junctions (not shown) configured to facilitate distributing process gases, heat transfer fluids, or power selectively to areas of the disk 202 and thermal control plate 204. In some embodiments, the process gases, heat transfer fluids, or power may be supplied by sources (e.g. the RF plasma supply 117, 117A, chucking power source 140, gas supply 141, fluid source 142, described above with respect to FIG. 1) coupled to respective conduits (e.g. gas supply lines 236, 234 and electrical conduit 232). In some embodiments, the gas supply 141 may provide a single gas, or in some embodiments may provide more than one gas. In some embodiments the gas supply 141 may be configured to selectively provide gases to separate sections of the electrostatic chuck 150, for example, at an interface 216 between the disk 202 and substrate S or an interface 218 between the disk 202 and the thermal control plate 204.

In some embodiments, a process kit, for example a deposition ring 206 as depicted in FIG. 2, may be disposed atop the substrate support 124 and around the substrate S to cover otherwise exposed portions of the substrate support 124. For example, in some embodiments, the deposition ring 206 may be disposed on a ledge 228 of the thermal control plate 204. The deposition ring 206 has a central opening that generally corresponds with the shape of the substrate S but typically extends beneath the substrate S, although not in direct contact therewith. The deposition ring also generally surrounds the disk 202 and a narrow gap may be defined between the inner edge of the deposition ring 206 and the outer edge of the disk 202. The deposition ring 206 protects covered portions of the substrate support 124 from damage due to processing (such as from the plasma or from sputtering or other process byproducts from the substrate S). The deposition ring 206 may be fabricated from any process compatible electrically insulative material. For example, in some embodiments, the deposition ring 206 may be fabricated from a dielectric material, such as a ceramic, aluminum nitride (AlN), silicon nitride (SiN), or the like.

In some embodiments, the disk 202, described more fully below with respect to FIGS. 2-7, generally comprises a body 245 having a substrate-facing surface 220 and a generally opposing thermal control plate-facing surface 222. In some embodiments, the substrate-facing surface 220 may comprise one or more first grooves 238 coupled to one or more first through holes 239 to facilitate providing a flow of gas, for example an inert gas, such as helium (He), argon (Ar), or the like, or other heat transfer fluid at the interface 216 between the disk 202 and substrate S to facilitate a heat transfer between the disk 202 and substrate S. The heat transfer gas may be delivered to the one or more first grooves 238 through one or more first holes 239 in the disk 202 which are in fluid communication with one or more first grooves 238. Additionally, in some embodiments, the thermal control plate-facing surface 222 may comprise one or more second grooves 240 coupled to one or more second through holes 241 to facilitate providing a flow of gas or other heat transfer fluid at the interface 218 between the disk 202 and the thermal control plate 204.

The disk 202 may be fabricated to have any dimensions and shape suitable to provide adequate support and sufficient heat transfer properties. For example, in some embodiments, the disk 202 may have a thickness on the order of the thickness of the substrate S, for example, up to about three times the thickness of the substrate S. In some embodiments, where the substrate S is a semiconductor wafer, the disk 202 may comprise a thickness of from about 1.0 mm to about 3 mm, or about 1.5 mm. In some embodiments, the disk 202 may have an outer edge 221 that is substantially perpendicular to the substrate-facing surface 220 and the thermal control plate 204 facing surface 222. Alternatively, in some embodiments, the outer edge 221 may have an angled edge 226 configured to interface with a corresponding angled edge 227 of the deposition ring 206 to eliminate a perpendicular line-of-sight from the processing volume to components of the substrate support 124 through the gap between the deposition ring 206 and the disk 202, thereby reducing or preventing plasma induced damage to the substrate support 124 components during processing.

The disk 202 may be coupled to the thermal control plate 204 via any means suitable to provide an adequate coupling and prevent movement of the disk 202 during processing. In some embodiments the disk 202 is removably coupled via an electrostatic attraction. In such embodiments, the disk 202 comprises one or more electrodes (described below) disposed within the body 245 proximate the thermal control plate-facing surface 222. Chucking power, for example a DC voltage, may be supplied from a power source (e.g., chucking power source 140 described in FIG. 1) to the electrode via one or more electrical conduits 232 disposed within the hollow support shaft 112, thereby creating sufficient electrostatic attraction to couple the disk 202 to the thermal control plate 204.

Alternatively or in combination, in some embodiments, the disk 202 may be mechanically coupled to the thermal control plate 204, for example, for example via mechanical fasteners such as bolts, screws, cams, clamps, springs, or the like, In some embodiments, a plurality of through holes (one shown) 230 may be provided in the disk 202 to interface with respective fasteners (e.g., a bolt, a screw, a cam, or the like), for example, as described below with respect to FIG. 6.

The thermal control plate 204 may comprise any material suitable to provide an adequate heat transfer from the disk 202 to the thermal control plate 204. For example, in some embodiments, the thermal control plate 204 may be fabricated from a metal, such as aluminum, nickel, or the like. In some embodiments, the thermal control plate 204 may comprise one or more channels 240 formed therein for circulating a heat transfer fluid to further facilitate a heat transfer from the disk 202 to the thermal control plate 204. In some embodiments, the thermal control plate 204 (as shown with plate 217) may have a thickness of about 10 to about 30 mm.

The insulating layer 208 may comprise any electrically insulating material suitable to provide an electrical insulation while providing adequate and stable support during processing. For example, in some embodiments, the insulating layer 208 may comprise a dielectric material, for example, a ceramic, aluminum nitride (AlN), silicon nitride (SiN), or the like. The insulating layer 208 is disposed within the support housing 210. The support housing 210 provides mechanical support to the insulating layer 208 and may be fabricated from a metal, for example aluminum. In embodiments where the support housing 210 is fabricated from an electrically conductive metal, the support housing 210 may be grounded, for example via a conductive connection to a grounded portion of the chamber 100 (described above).

Figure 3:
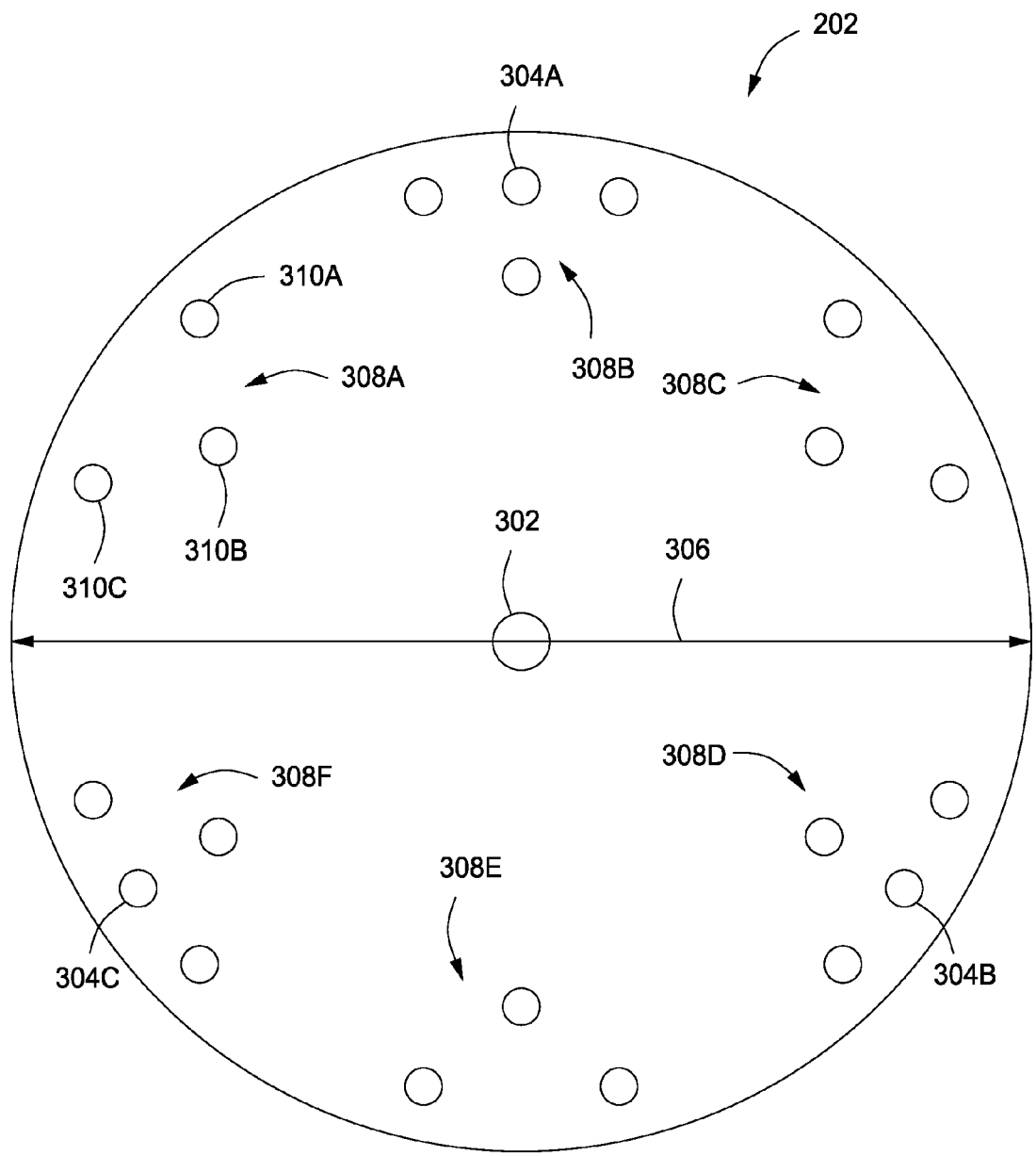
FIG. 3 depicts a top view of a disk of an electrostatic chuck in accordance with some embodiments of the present invention.

Referring to FIG. 3, the disk 202 may have any dimensions suitable for the particular process chamber used, process performed, or substrate processed. For example, in embodiments where a 300 mm semiconductor wafer is being processed, the disk 202 may have a diameter 306 of about 270 to about 320 mm, or in some embodiments, about 290 mm.

In some embodiments, the disk 202 may comprise a plurality of through holes to facilitate, for example, mounting the disk 202 to the thermal control plate, providing a gas to a substrate disposed atop the disk 202, or allowing lift pins to raise and lower the substrate from the surface of the disk 202. For example, in some embodiments, the disk 202 may comprise a plurality of mounting holes 310A-C to facilitate coupling the disk 202 to the thermal control plate 204. In such embodiments, the disk 202 may be coupled to the thermal control plate 204 via a series of clamp screws, or bolts (e.g., as described below with respect to FIG. 6). In some embodiments, the mounting holes 310A-C may be grouped and positioned at equal intervals throughout the surface of the disk 202. For example, in some illustrative and non-limiting embodiments, six groups 308A-F of three mounting holes 310A-C each may be positioned at 60 degree intervals around the disk 202, as shown in FIG. 3. Other configurations of the number and distribution of connections between the disk 202 and the thermal control plate 204 may be utilized as well.

In some embodiments, the disk 202 may comprise one or more gas holes 302 to provide a gas flow from the gas supply 141 (described above) to the substrate interface between the disk 202 and the substrate S (e.g., via the first grooves discussed above) to contact the back side of the substrate disposed atop of the disk 202. Control over the gas pressure provided to the substrate interface facilitates control over heating and cooling of the substrate. In some embodiments, and as shown in FIG. 3, the gas hole 302 may be centrally located in the disk 202. Although only one gas hole 302 is shown in FIG. 3, any amount of gas holes 302 may be provided to disperse a gas as desired.

In some embodiments, the disk 202 may further comprise a plurality of lift pin holes 304A-C configured to allow lift pins (e.g., the lift pins 109 coupled to the substrate lift 130 of chamber 100, described above in FIG. 1) to travel freely therethrough. As such, the lift pins may controllably interface with a surface of a substrate disposed atop the disk 202 to facilitate the placement and removal of the substrate. The lift pin holes 304A-C may be positioned in any configuration suitable to provide even support to the substrate. For example, in some embodiments, such as depicted in FIG. 3, each of the lift pin holes 304A-C may be positioned at approximately 120 degree intervals around the disk. In addition, in some embodiments the distance from the center of the disk 202 may be varied to accommodate a size of the substrate being processed or the size of the disk 202. For example, in embodiments where a 300 mm semiconductor wafer is being processed, the lift pin holes 304A-C may be disposed about bolt circle of between 230 to 280 mm.

Figure 9:
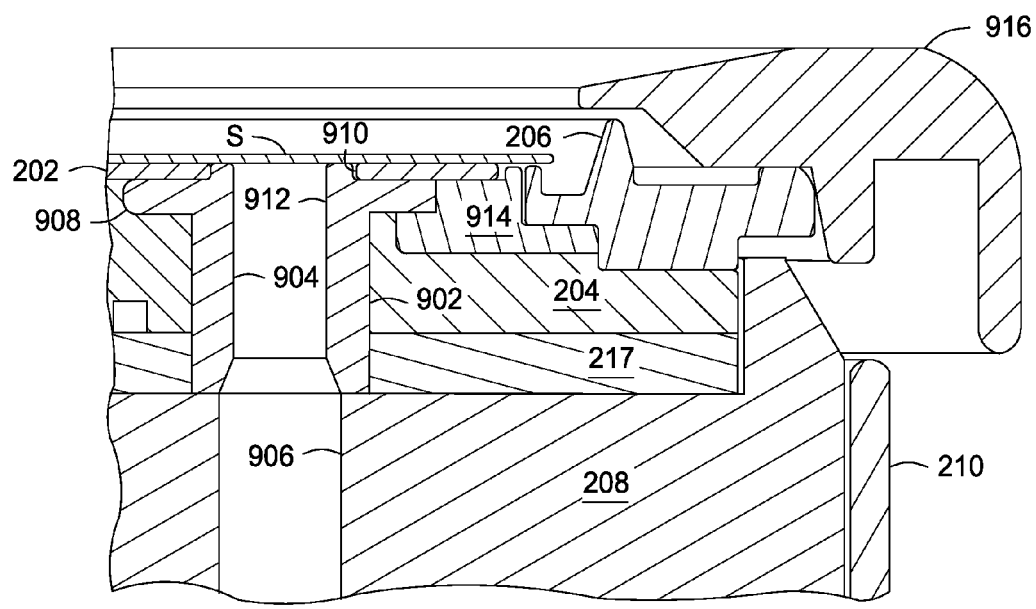
FIG. 9 depicts a partial side view in cross-section of a portion of an electrostatic chuck in accordance with some embodiments of the present invention.

In some embodiments, and as depicted in FIG. 9, a lift pin guide 902 may be provided to facilitate guiding a lift pin (not shown) to a back surface of the substrate S to raise and lower the substrate S. In some embodiments, the lift pin guide 902 may be generally disposed within the thermal control plate 204 (and the plate 217, when present). The lift pin guide includes an opening 904 to receive the lift pin. A corresponding opening 906 may be provided within the isolation layer 208, (and any other intervening layers) to facilitate travel of the lift pin therethrough.

An opening 910 in the disk 202 is provided to facilitate travel of the lift pin therethrough and to allow the lift pin to contact the back surface of the substrate S. In some embodiments, the opening 910 in the disk 202 may be large enough to accommodate a raised lip 912 extending from the upper portion of the lift pin guide 902. The raised lip 912 may extend into the opening 910 to provide a locating and retaining feature to facilitate alignment of the disk 202 and to prevent undesired motion of the disk 202, for example, during assembly or when the disk 202 is not electrostatically (or otherwise) clamped to the thermal control plate 204.

In some embodiments, a flange 908 may be provided proximate an upper portion of the lift pin guide 902 to facilitate retaining the lift pin guide within the thermal control plate 204 and/or to provide a longer path from the processing region of the process chamber, through the opening 910 in the disk 202, and to the thermal control plate 204 which may be RF hot during processing, thereby preventing or limiting any arcing that may occur. An isolation ring 914 may be provided atop the thermal control plate 204, between the thermal control plate 204 and an outer edge of the disk 202, adjacent to and radially inward of the deposition ring 206. The isolation ring 914 may be fabricated from a suitable dielectric material and may also provide a lengthened and/or discontinuous path between the processing volume and the thermal control plate, or other RF hot components, to prevent or limit any arcing that may occur. A deposition shield 916 may be provided atop the deposition ring 206 to further protect portions of the process chamber and/or components thereof, from unwanted deposition during processing.

Figure 4A:
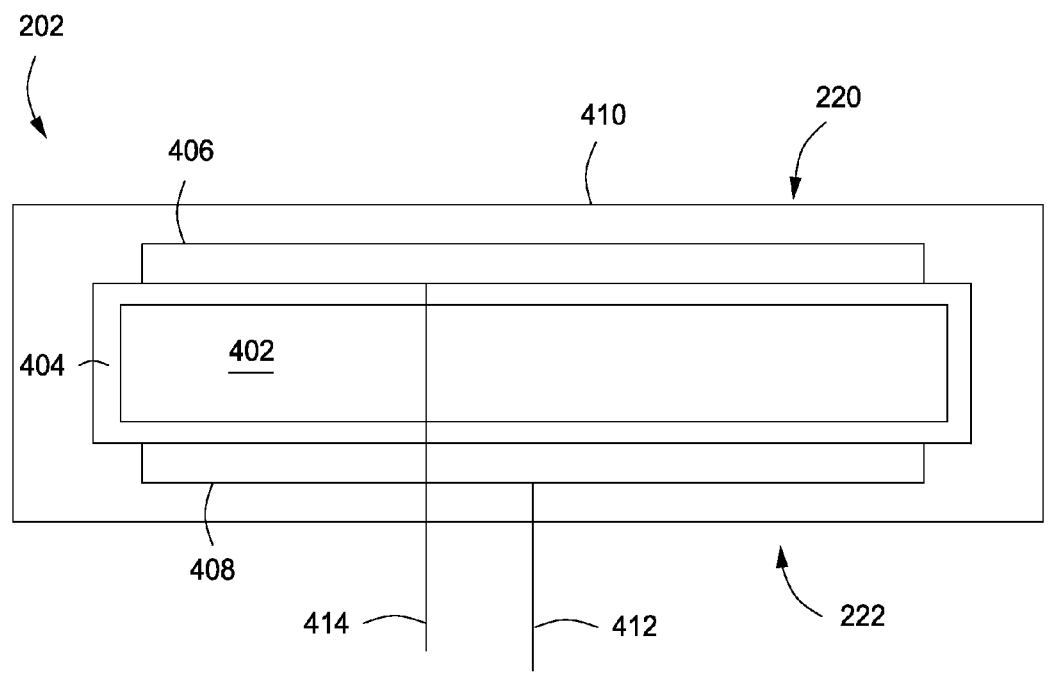
FIGS. 4A-B depict side views of a disk in accordance with some embodiments of the present invention.
Figure 4B:
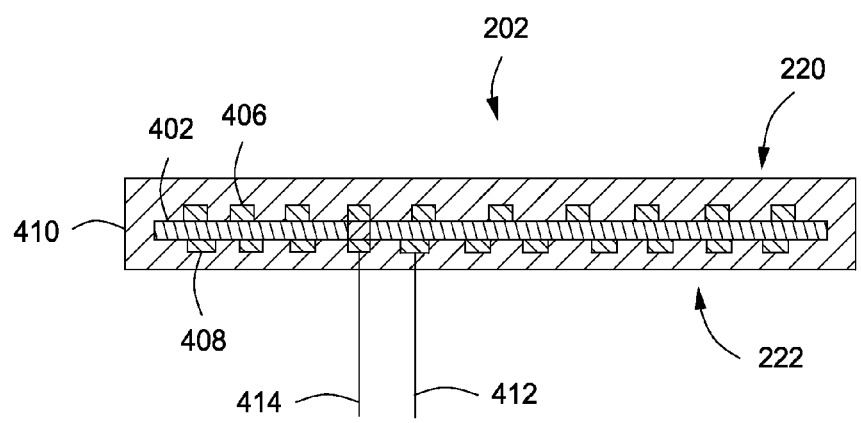

Referring to the cross section view of the disk 202 in FIGS. 4A-B, in some embodiments, the disk 202 may generally comprise a base layer 402 and two or more electrodes (two shown) 406, 408 disposed between two dielectric layers 404, 410 (e.g., a first dielectric layer 404 and a second dielectric layer 410). In some embodiments, the base layer 402 may comprise any material and geometry suitable to provide an adequate template for forming the shape and features (e.g. the through holes or grooves described above) of the disk 202. For example, in some embodiments the base layer 402 may comprise a carbon based material, for example graphite. In some embodiments the base layer 402 may comprise other process compatible dielectric materials, such as pyrolytic boron nitride (PBN), polyimide, silicon (such as a silicon wafer), or the like. The base layer 402 may have any dimensions suitable to create a disk 202 having desired dimensions. For example, in some embodiments the base layer 402 may be between about 0.5 to about 2.5 mm thick, or in some embodiments, about 1.8 mm thick.

In some embodiments, the base layer 402 and the first dielectric layer 404 may be the same layer—e.g., either layer may be considered as optional and a singular dielectric layer may be provided as the base layer 402 and the dielectric layer 404. Suitable dielectric materials for such embodiments include pyrolytic boron nitride, polyimide, and the like.

The base layer 402 may be fabricated via any means suitable to form the base layer 402 having the desired dimensions and features. For example, the base layer 402 may be formed via a physical process (e.g., powder press, extrusion) and machined to form the features. Alternatively, the base layer 402 may be fabricated via a deposition process and subsequently etched to form the features.

In some embodiments, a first dielectric layer 404 may be disposed atop the base layer 402. The first dielectric layer 404 may be any dielectric material suitable to provide mechanical support to the disk 202 and a high thermal conductivity to facilitate heat transfer. For example, in some embodiments, the first dielectric layer 404 may comprise boron nitride (BN), or in some embodiments, a pyrolytic boron nitride (PBN). The first dielectric layer 404 may be formed via any means suitable to provide a conformal layer at a desired thickness. For example, the first dielectric layer 404 may be formed via a deposition process, such as a chemical vapor deposition process, to a thickness of about 0.05 to about 0.40 mm.

In some embodiments, the two or more electrodes 406, 408 may be disposed atop the first dielectric layer 404. The first electrode 406 may be disposed proximate the substrate-facing surface 220 and the second electrode 408 may be disposed proximate the thermal control plate-facing surface 222. Each of the two or more electrodes 406, 408 may be independently electrically coupled to at least one of an AC power supply or a DC power supply (e.g., power source 140 in FIG. 1) via a conductor (e.g., 412, 414) and a terminal (for example, as discussed below with respect to FIGS. 7-8) coupled to each electrode 406, 408. In some embodiments, each of the two or more electrodes 406, 408 may be coupled to its respective power supply via a terminal disposed within a through hole (not shown) disposed in the disk 202, for example, such as terminal 702 described below with respect to FIG. 7, or terminal 814 described below with respect to FIG. 8. For example, in some embodiments, the electrodes 406, 408 may be patterned electrodes disposed on the base 402 (or dielectric layer 404, when present), as depicted more clearly in FIG. 4B. The electrode 406 near the substrate-facing surface 220 of the disk 202 may be coupled to the power source via a conductor disposed through the base 402. For example, an opening may be formed through the base 402. The opening may be coated and/or filled with a conductive material and may be coupled, for example by brazing, to a contact disposed on the opposing side of the base 402.

The two or more electrodes 406, 408 may be made of any suitable electrically conductive material, such as a metal or metal alloy, for example. In addition, the two or more electrodes 406, 408 may be any shape, for example, disks, rings, wedges, strips, a patterned electrical trace, or the like. The two or more electrodes 406, 408 may be fabricated in any suitable fashion, such as by deposition, plating, printing, or the like. In some embodiments, either or both of the two or more electrodes 406, 408 may comprise more than one, for example two, electrodes disposed proximate the substrate-facing surface 220 and/or the thermal control plate-facing surface 222. For example, in some embodiments where a bi-polar chuck is provided, the first electrode 406 may include two semicircular or "D" shaped plate electrodes, with each plate electrode attached to one terminal of the power supply. In some embodiments, the second electrode 408 may also include two electrodes. Other electrode configurations may be utilized as well.

Either or both of the two or more electrodes 406, 408 may be configured to selectively function as a heating electrode and/or a chucking electrode. For example, in some embodiments, a DC power may be applied to the first electrode 406, creating a charge on the substrate-facing surface 220, creating an attraction to an oppositely charged substrate S, thus facilitating electrostatic chucking of the substrate S to the disk 202. In some embodiments, AC power may be applied to the second electrode 408, creating heat due to resistance of the second electrode 408, thereby facilitating heating of the disk 202. The AC power may be sufficient to heat the electrostatic chuck up to about 600 degrees Celsius. For example, an AC power supply may provide from about 110 to about 208 $V_{AC}$ to the second electrode 408. In some embodiments, during use, the electrostatic chuck temperature may be monitored by monitoring the resistance of the resistive heating elements and calculating the resultant temperature by reason of the physical properties of the resistive element wherein the resistance varies in proportion the temperature of the element.

In addition, in some embodiments, RF power may be applied to one or both of the two or more electrodes 406, 408 to generate a bias on the substrate S and/or to provide RF power to a chamber (i.e., chamber 100 described above) to form a plasma. For example, the RF power supply 117, discussed above with respect to FIG. 1 (or a similar RF power supply), may be used to provide RF power to either of the electrodes 406, 408.

In some embodiments, both a DC power and an AC power may be applied simultaneously to one or both of the two or more electrodes 406, 408 to facilitate utilizing the first electrode 406, the second electrode 408, or both, as a heating electrode and a chucking electrode simultaneously. For example, in such embodiments, a DC power may be applied to the first electrode 406 to facilitate electrostatically chucking a substrate to the substrate-facing surface 220 and DC power and AC power may be simultaneously applied to the second electrode 408 to heat the disk 202 and electrostatically chuck the disk 202 to the thermal control plate 204.

In some embodiments, the second dielectric layer 410 may be disposed atop the two or more electrodes 406, 408. The second dielectric layer 410 may be any dielectric material suitable to provide mechanical support to the disk 202 and provide a high thermal conductivity to facilitate heat transfer. In some embodiments, the second dielectric layer 410 may comprise, the same, or in some embodiments a different material than the first dielectric layer 402. For example, in some embodiments, the second dielectric layer 410 may comprise boron nitride (BN), or in some embodiments, a pyrolytic boron nitride (PBN). In some embodiments, the second dielectric layer 410 may be formed via any means suitable to provide a conformal layer at a desired thickness. For example, second dielectric layer 410 may be formed via a deposition process, such as a chemical vapor deposition process, to a thickness of about 0.02 to about 0.30 mm. In some embodiments, the thickness of the dielectric layer 410 may be selected based upon the intended use as a Coulombic electrostatic chuck or a Johnson-Rebeck electrostatic chuck. For example, in some embodiments where a Coulombic electrostatic chuck is desired, the thickness of the dielectric layer 410 may be between about 0.050 to about 0.300 mm for ceramic materials, or between about 0.005 to about 0.003 inches (about 0.0127 to about 0.0762 mm) thick for polyimide materials. In some embodiments where a Johnson-Rebeck electrostatic chuck is desired, the thickness of the dielectric layer 410 may be up to about 1 mm for ceramic materials.

In addition to the above, other or additional properties of the materials selected to fabricate the disk 202 may be beneficial to the present invention. For example, in some embodiments, the overall coefficient of thermal expansion of the disk 202 may be substantially similar to the coefficient of thermal expansion of a substrate (e.g., substrate S described in FIG. 1) disposed thereon. By providing substantially similar coefficient of thermal expansions both the substrate and the disk 202 expand at a substantially similar rate when heated, thereby reducing friction between the substrate, thus reducing damage to the substrate when heated.

Figure 5:
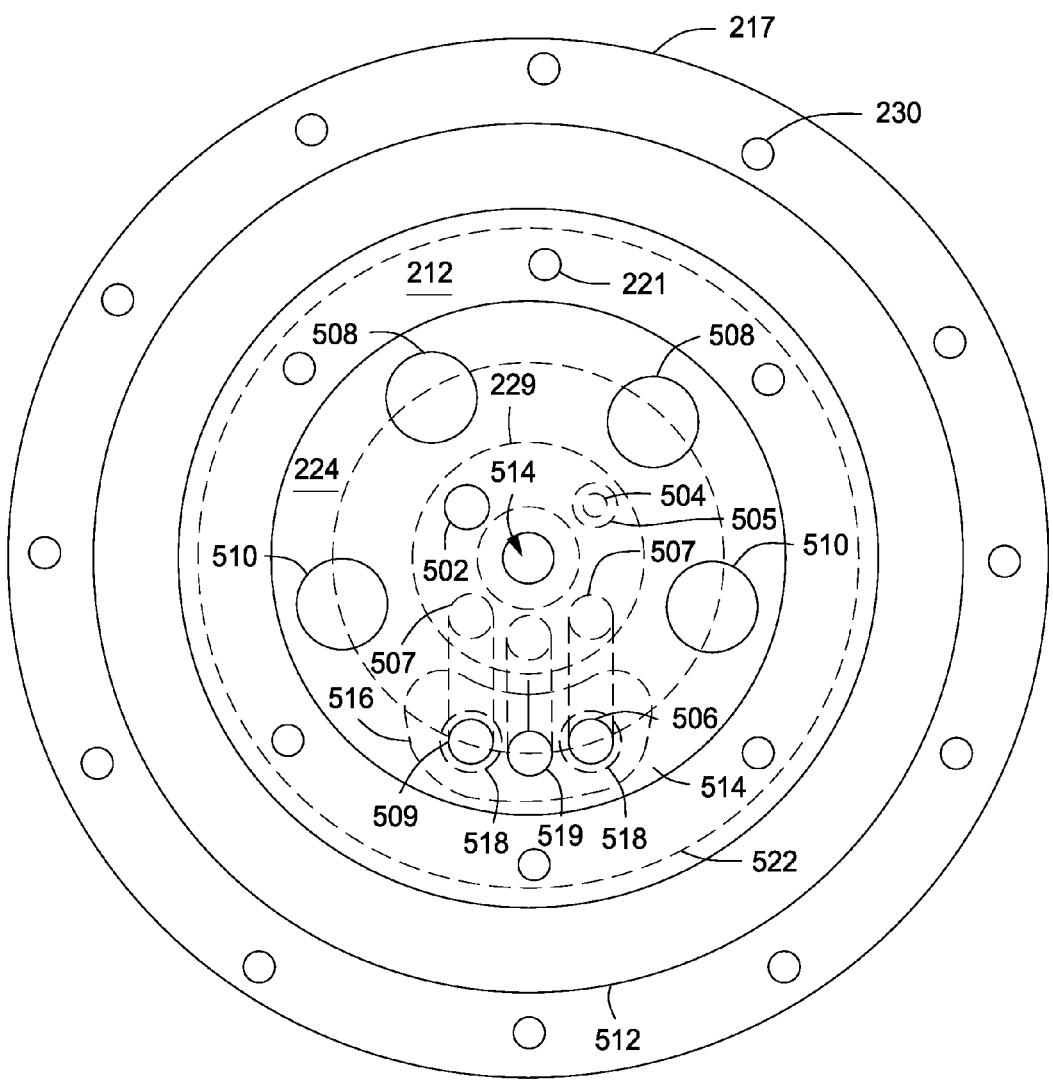
FIG. 5 depicts a top view of an electrostatic chuck in accordance with some embodiments of the present invention.

Referring to FIG. 5, in some embodiments, the manifold 235 may be configured to selectively provide process gases, power, heat transfer fluids or the like to the disk (discussed above) and thermal control plate (discussed above) via a plurality of ports (e.g., AC ports 508 and DC ports 510) and inlets/outlets (e.g., wafer gas inlet 514, disk gas inlet 502, cooling fluid inlet 506 and outlet 509). For example, in some embodiments, two or more water lines (two shown) 507 may be coupled to a plate 516 having the cooling fluid inlet 506 and the cooling fluid outlet 509 for delivering a flow of heat transfer fluid (e.g., water) to the thermal control plate (discussed above). An o-ring 518 may be disposed around each of the inlet 506 and outlet 509 to prevent heat transfer fluid leakage. In addition, an o-ring may be disposed proximate the edge of the plate 516 to further prevent leakage of the heat transfer fluid to other areas of the electrostatic chuck 105. Additionally, in some embodiments, a water leak vent 509 may also be coupled to the plate 516 to remove leaked heat transfer fluid.

In some embodiments, a gas inlet 514 may be disposed proximate the center of the manifold 235 to provide heat transfer gases to interface 220 or to interface 222 (described above).

In some embodiments, the manifold 235 may further comprise two or more (four shown) electrical ports 508, 510 configured to provide power (e.g., RF power, AC power, or DC power) to the disk. For example, in some embodiments, the manifold 235 may comprise two AC power ports 508 for providing AC power to the one or more electrodes disposed within the disk (described above) to facilitate heating the disk and substrate disposed thereon. Alternatively or in combination, in some embodiments, the manifold 235 may comprise two DC power ports for providing DC power to the one or more electrodes disposed within the disk to facilitate chucking the disk to the thermal control plate (described above) and/or chucking a substrate to the disk (described above).

In some embodiments, the manifold 235 may further comprise one or more (one shown) ports 504 to provide access to the disk to facilitate temperature monitoring. For example, in some embodiments, one or more ports 504 may be provided to facilitate placing a thermocouple 505 substantially near, or touching the disk to facilitate temperature monitoring. Alternatively or in combination, the temperature of the disk may also be monitored by measuring a change in resistivity via voltage and current measurements at the power supply providing the disk with power (i.e., power supply 140 described above).

In some embodiments, o-rings, insulators, gaskets or the like may be disposed between the manifold 235, housing 224 and vacuum plate 217 to prevent fluid or electrical leakage. For example, in some embodiments, an RF gasket 522 may be disposed atop the housing 224 to reduce or prevent radio frequency (RF) interference when coupled to the vacuum plate 217. Also to electrically couple the housing 224 to the thermal control plate 202 for more efficient delivery of RF power to the thermal control plate 202.

The manifold 235 may be fabricated from any material suitable to provide process gases, power, heat transfer fluids or the like to the disk and thermal control plate. For example, in some embodiments the manifold 235 may be fabricated from a ceramic, or in some embodiments, from a metal, such as aluminum, stainless steel, titanium, or the like. The manifold 235 may be coupled to the vacuum plate 217 via any means suitable to provide an adequate coupling. For example, in some embodiments the manifold 235 may be coupled to the vacuum plate 217 via welding or brazing. In some embodiments, an o-ring 512 may be disposed atop the vacuum plate 217 to form a vacuum seal between the vacuum plate 217 and thermal control plate (not shown) when disposed thereon.

Figure 6:
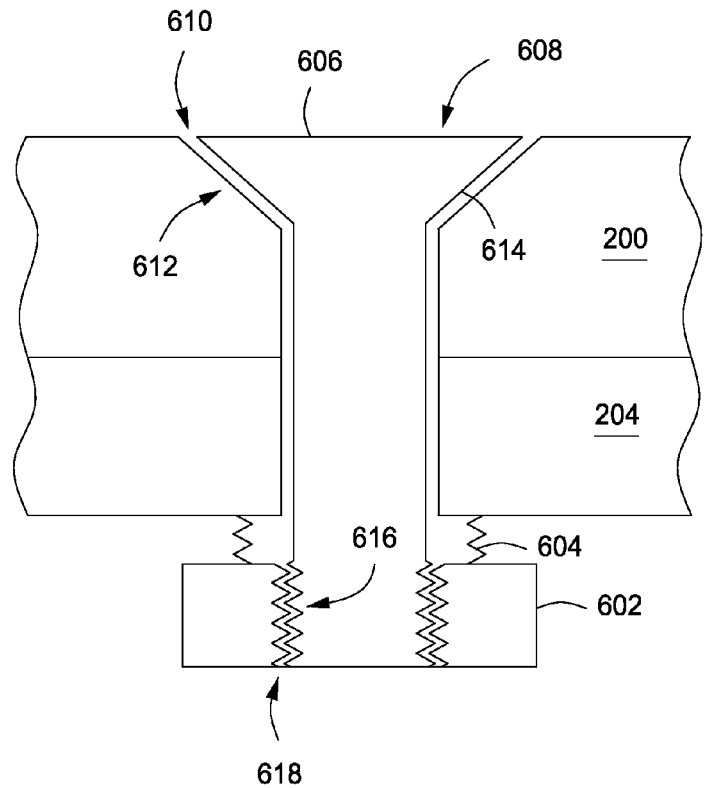
FIG. 6 depicts a coupling for use with an electrostatic chuck in accordance with some embodiments of the present invention.

Referring to FIG. 6, in some embodiments, the disk 202 may be coupled to the thermal control plate via a flexible screw and nut configuration 608. In such embodiments, thermal control plate 204 and disk 202 comprises a through hole 610 having dimensions suitable to interface with a screw 606. In some embodiments, the through hole 610 may have dimensions larger than that of the screw 606 to allow each of the thermal control plate 204 and disk 202 to move independently of one another, thereby reducing damage to the thermal control plate 204 and/or disk 202 caused by differences in thermal expansion. The screw 606 may be any suitable type of screw, for example, a machine screw, thumb screw, clamp screw or the like. In some embodiments, the screw 606 may comprise a tapered head 614 configured to interface with a tapered end 612 of the through hole 610 such that the tapered head 614 can clamp down the disk 202 when the screw 606 is tightened and is disposed even with or below an upper surface of the disk 202. The screw 606 may be fabricated from any material suitable to provide adequate coupling of the thermal control plate 204 and disk 202, for example, a metal, such as aluminum, titanium, stainless steel, or the like.

In some embodiments a nut 602 is disposed beneath the thermal control plate 204 and comprises a series of threads 618 configured to interface with a threaded end 616 of the screw 606. The nut 602 may be fabricated from any material suitable to provide a secure coupling of the thermal control plate 204 to the disk 202, for example a metal, such as aluminum, titanium, stainless steel, or the like. In some embodiments, the nut 602 may be fabricated from the same, or different, material than that of the screw 606.

In some embodiments, a biasing member 604 may be disposed between the thermal control plate 204 and nut 602 to maintain a desired clamping pressure on the thermal control plate 204 and disk 202 while allowing for thermal expansion of the thermal control plate 204 and/or disk 202. Although only one screw and nut configuration 608 is shown, any number of screw and nut configurations 608 may be utilized to couple the disk 202 to the thermal control plate 204.

Figure 7:
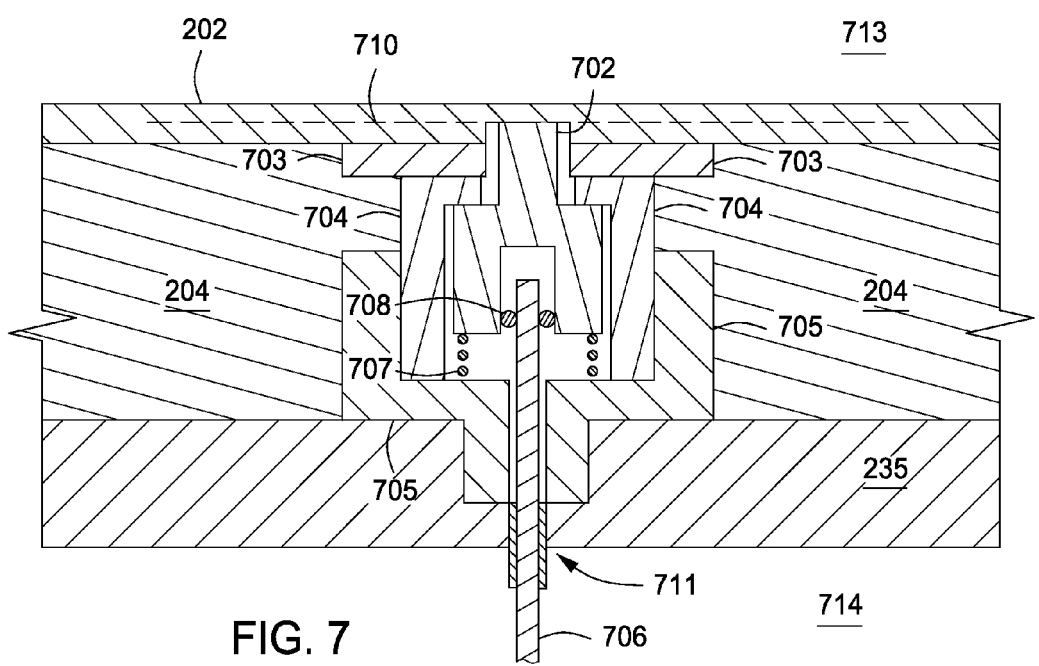
FIGS. 7 and 8 depict terminals for use with an electrostatic chuck in accordance with some embodiments of the present invention.

Referring to FIG. 7, in some embodiments, electrical power may be delivered to an electrode 710 within the disk 202 by way of a terminal 702. The terminal 702 may be electrically coupled to a conductor 706 via a spring element 708 to maintain sufficient electrical connection during any vertical movement of the terminal 702. Force applied to the electrode 710 of the disk 202 could be controlled by way of a suitable spring 707 that biases the terminal 702 toward the electrode 710. Elements 703, 704, and 705 may provide a housing for the terminal 702 and may be made of suitable insulating material to electrically isolate the electrical elements (e.g., the terminal 702 and the conductor 706 from the thermal control plate 204 or any other conductive elements in the vicinity of the power feedthrough 711. The power feedthrough 711 may be coupled to the manifold 235 by use of welding, brazing, or other similar joining technique, so as to create a vacuum tight connection between areas 713 (for example, a process volume within the process chamber) and 714 (for example, a region isolated from the process volume).

Figure 8:
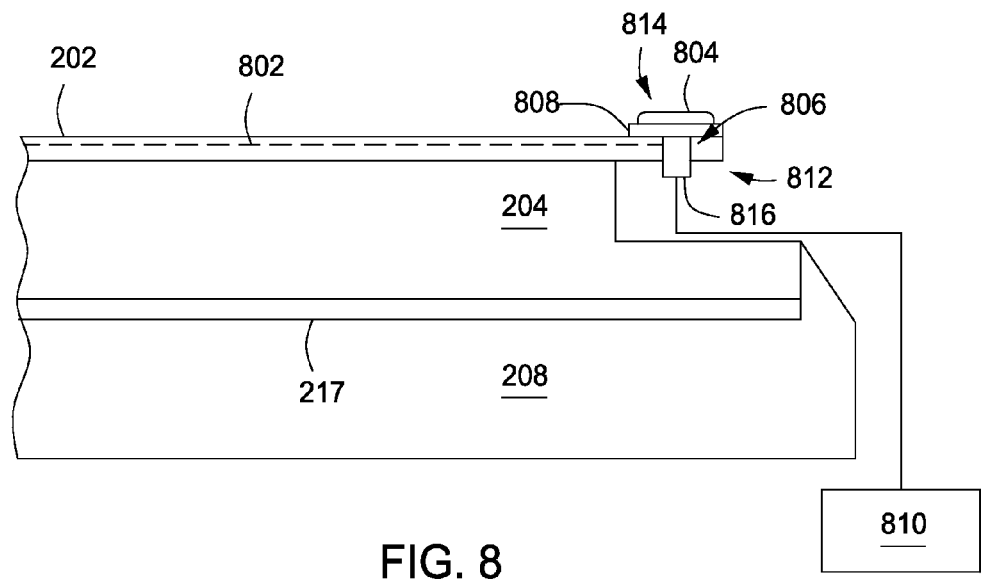

Referring to FIG. 8, in some embodiments, the disk 202 may be electrically coupled to a power supply 810 via one or more terminals 814 (one shown) disposed within a through hole 806 formed in the disk 202. The through hole 806 may be formed in any location on the disk 202 that may provide a connection between an electrode 802 disposed within the disk 202 and the power supply 810. In some embodiments, the through hole 806 may be formed proximate an outer edge 812 of the disk 202, or alternatively, may be formed within an outwardly extending tab formed integrally with the body of the disk 202.

In some embodiments, the terminal 814 may comprise a shaft 816 having dimensions suitable to fit within the through hole 806 and a flared head 804 to secure the terminal 814 in a static position within the through hole 806. The terminal 814 may comprise any material suitable to couple the disk 202 to the power supply 810. For example, the terminal 814 may comprise a metal, such as aluminum, titanium, stainless steel, or the like.

In some embodiments, a washer 808 may be disposed between the flared head 804 and the disk 202 to reduce damage to the disk 202 cause by friction between the terminal 814 and the disk 202.

Although only one terminal 814 is shown, any number of terminals may be utilized. For example, in embodiments where the disk may comprise more than one electrode (discussed above), each electrode may be respectively coupled to one or more terminal 814 to facilitate independent delivery of power to each electrode.

In operation of the electrostatic chuck 105, rapid heating or cooling of the substrate S may be facilitated via selectively providing gas and/or a chucking power to the interface 216 between the disk 202 and substrate S and the interface 218 between the disk 202 and the thermal control plate 204. In some embodiments, the disk 202 may be heated or cooled at a rate of up to about 50 degrees Celsius per second, or in some embodiments, a heating rate of up to about 150 degrees Celsius per second and a cooling rate of up to about 20 degrees Celsius per second.

For example, in some embodiments, to rapidly heat the substrate S, a thermally conductive gas (e.g., argon, helium, or the like) may be provided to the interface 216 between the disk 202 and substrate S while providing an AC power to one or both electrodes of the disk 202 to heat the disk. The presence of the gas improves a heat transfer between the substrate S and disk 202, thereby providing an increased rate of heating. In addition, a chucking power may be provided to the electrode 406 of the disk 202 to chuck the substrate S to the disk 202 to further improve the heat transfer between the substrate S and disk 202, thereby further facilitating a rapid heating of the substrate S.

In addition, the disk may be poorly thermally coupled to the thermal control plate to further enhance the rate of heating of the substrate. For example, in embodiments where a backside gas grooves are provided between the disk and the thermal control plate, the flow of gas may be reduced or terminated to reduce the rate of heat transfer from the disk to the thermal control plate. Alternatively or in combination, in embodiments where a chucking electrode is provided proximate the thermal control plate, the power to the electrode may be reduced or terminated to reduce clamping pressure between the disk and the thermal control plate to reduce the rate of heat transfer from the disk to the thermal control plate.

In some embodiments, to rapidly cool the substrate S, a thermally conductive gas (e.g. argon, helium, or the like) may be provided to the interface 218 between the disk 202 and the thermal control plate 204. For example, in some embodiments, the operating pressure in the chamber may be less than about 30 mTorr. The pressure between the disk 202 and the thermal control plate 204 may be maintained, by providing the conductive gas, at between about 2 to about 20 Torr. The presence of the gas improves a heat transfer between the disk 202 and thermal control plate 204, thereby providing an increased rate of cooling. In addition, a chucking power may be provided or increased to the electrode 408 of the disk 202 to increase the clamping pressure of the disk 202 to the thermal control plate 204 to further improve the rate of heat transfer between the disk 202 and thermal control plate 204, thereby further facilitating a rapid cooling of the disk 202 and the substrate S.

By providing a robust clamping force between the disk and the substrate S and by providing a disk that can rapidly heat and cool, the disk 202 and the substrate S will heat and cool and substantially similar rates. As the disk 202 has a coefficient of thermal expansion that is similar to that of the Substrate S, friction between the substrate S and electrostatic chuck 150 due to differing rates of thermal expansion or contraction may be reduced or eliminated, thereby reducing or eliminating damage to the substrate S.

Thus, electrostatic chucks and methods of use thereof have been provided that may advantageously provide an electrostatic chuck that may be rapidly heated and cooled simultaneously with the rapid heating and cooling of a substrate disposed thereon. The inventive electrostatic chuck may provide process flexibility and increased throughput in substrate processing. The inventive electrostatic chuck may further advantageously reduce or eliminate damage to the substrate resulting from friction between the substrate and the electrostatic chuck due to differences in rates of thermal expansion during processing.

While the foregoing is directed to embodiments of the present invention, other and further embodiments of the invention may be devised without departing from the basic scope thereof.

The invention claimed is:

1. An electrostatic chuck, comprising:
a disk having a first side to support a substrate thereon and a second side, opposing the first side, to provide an interface to selectively couple the disk to a thermal control plate, a first electrode disposed within the disk proximate the first side to electrostatically couple the substrate to the disk and a second electrode disposed within the disk proximate the second side to electrostatically couple the disk to the thermal control plate.

2. The electrostatic chuck of claim 1, further wherein the second electrode is further configured to heat the disk.

3. The electrostatic chuck of claim 1, further comprising:
at least one groove formed in the second side of the disk or in the thermal control plate to flow a heat transfer fluid between the disk and the thermal control plate.

4. The electrostatic chuck of claim 3, wherein the heat transfer fluid comprises argon or helium gas.

5. The electrostatic chuck of claim 1, wherein the disk further comprises at least one groove formed in the first side to flow a heat transfer fluid between the first side of the disk and the substrate.

6. The electrostatic chuck of claim 1, wherein the disk further comprises:
a base;
a first layer of dielectric material disposed atop the base, wherein the first electrode and second electrode are disposed atop the first layer of dielectric material; and
a second layer of dielectric material disposed atop the first electrode and second electrode.

7. The electrostatic chuck of claim 6, wherein the base comprises graphite, pyrolytic boron nitride, or silicon.

8. The electrostatic chuck of claim 6, wherein the first and second layer of dielectric material comprises pyrolytic boron nitride.

9. The electrostatic chuck of claim 1, wherein the disk further comprises:
a dielectric base, wherein the first electrode and second electrode are disposed atop the dielectric base; and
a layer of dielectric material disposed atop the first electrode and second electrode.

10. The electrostatic chuck of claim 1, further comprising:
a thermal control plate disposed beneath the second side of the disk and selectively coupleable to the disk via an electrostatic attraction when power is provided to the second electrode.

11. The electrostatic chuck of claim 10, further comprising:
a support shaft to support the thermal control plate, wherein the shaft comprises a conduit to provide at least one of heat transfer fluids, process gases, AC power, DC power, or RF power to the electrostatic chuck.

12. The electrostatic chuck of claim 1, wherein the disk has a coefficient of thermal expansion that is substantially equal to a coefficient of thermal expansion of the substrate.

13. The electrostatic chuck of claim 1, wherein the disk has a thickness of about three times greater than a thickness of the substrate.

14. The electrostatic chuck of claim 1, wherein the disk has a thickness of about 1.0 to about 2.5 mm.

15. A method of processing a substrate, comprising:
placing an electrostatic chuck on a thermal control plate, the electrostatic chuck comprising a disk having a first side to support a substrate thereon and a second side, opposing the first side, providing an interface with the thermal control plate, wherein a first electrode is disposed within the disk proximate the first side to electrostatically couple the substrate to the disk, and wherein a second electrode is disposed within the disk proximate the second side to selectively electrostatically couple the disk to the thermal control plate;
clamping a substrate to the first side of the disk by providing power to the first electrode; and
selectively increasing or decreasing a rate of thermal conductivity through the interface between the second side of the disk and the thermal control plate to control the rate of heat transfer between the disk and the thermal control plate.

16. The method of claim 15, further comprising:
decreasing the rate of thermal conductivity through the interface when heating the substrate.

17. The method of claim 16, wherein decreasing the rate of thermal conductivity through the interface comprises at least one of:
decreasing a pressure of a gas provided to the interface via one or more grooves disposed between the disk and the thermal control plate; or
decreasing a chucking voltage provided to the second electrode to electrostatically clamp the disk to the thermal control plate.

18. The method of claim 15, further comprising:
increasing the rate of thermal conductivity through the interface when cooling the substrate.

19. The method of claim 18, wherein increasing the rate of thermal conductivity through the interface comprises at least one of:
increasing a pressure of a gas provided to the interface via one or more grooves disposed between the disk and the thermal control plate; or
increasing a chucking voltage provided to the second electrode to electrostatically clamp the disk to the thermal control plate.

20. The method of claim 15, further comprising at least one of:
providing an AC current to the second electrode to heat the disk and the substrate; or
providing an AC current to the first electrode to heat the disk and the substrate.

* * * * *